United States Patent [19]  [11] Patent Number: 4,920,077
Mora  [45] Date of Patent: Apr. 24, 1990

[54] METHOD OF MANUFACTURING MONOLYTHIC INTEGRATED CIRCUITS

[75] Inventor: Marco Mora, Bergamo, Italy

[73] Assignee: SGS-Thomson Microelectronics S.r.L., Milan, Italy

[21] Appl. No.: 249,788

[22] Filed: Sep. 27, 1988

[30] Foreign Application Priority Data

Oct. 9, 1987 [IT] Italy ............................ 22216 A/87

[51] Int. Cl.$^5$ ................... H01L 21/00; H01L 21/02; H01L 21/285; H01L 21/90
[52] U.S. Cl. ............................... 437/240; 437/225; 437/228; 437/235; 437/238; 437/247; 427/96; 427/99; 427/38; 427/39
[58] Field of Search ............... 437/49, 194, 195, 247, 437/980, 225, 228, 235, 238, 240; 148/DIG. 3, DIG. 8, DIG. 133; 427/96, 99, 38, 39

[56] References Cited

U.S. PATENT DOCUMENTS 4,380,115  4/1983  Pomante ............................ 437/228

FOREIGN PATENT DOCUMENTS 0225224  6/1987  European Pat. Off. .
0057458  4/1984  Japan ................................ 437/194
0030054  2/1986  Japan ................................ 437/194
2058731  4/1981  United Kingdom .

OTHER PUBLICATIONS

Wolf, S., Silicon Processing for the VLSI Era, Chap. 6, Lattice Press, 1986.
Sze, S., VLSI Technology, Chap. 3, McGraw–Hill, 1983.
Ghandhi, S., VLSI Fabrication Principles, Chapters 8 & 11, Wiley & Sons, 1983.
Opredkar, R., Influence of an Insulating Film on Plasma Silicon Dioxide Deposition Rates, J. Electrochem. Soc., Solid—State Sci. & Tech., 133(1986), Jul., No. 7, pp. 1431–1432.

Primary Examiner—Brian E. Hearn
Assistant Examiner—B. Everhart
Attorney, Agent, or Firm—Rosen, Dainow & Jacobs

[57] ABSTRACT

A method is disclosed wherein monolithic integrated circuit undergo a so-called aluminum annealing process step and so-called passivation step carried out within a deposition reactor of the PECVD type at a temperature of 420° to 450° C. and a pressure of 1 to 1.5 Torr. Applications of this method results in an increased electrical yield of the circuits produced and a reduction of their manufacturing costs.

7 Claims, No Drawings

METHOD OF MANUFACTURING MONOLYTHIC INTEGRATED CIRCUITS

DESCRIPTION

This invention relates to a method of manufacturing monolithic integrated circuits, particularly of the VLSI (Very Large Scale Integrated) CMOS (Complementary Metal Oxide Semiconductor) type.

As is known, the structure of a monolithic integrated circuit basically comprises a small plate, or chip, of a semiconductor material wherein the various active and passive circuit components are formed.

Such components are interlinked by a connection arrangement provided in a predetermined number of link levels or planes which are isolated from one another by layers of a dielectric material.

The first or innermost level in the structure is the so-called diffusion level or junction, and usually comprises a suitably doped substrate of crystalline silicon.

The last level is referred to as the metallization level on account of it being formed by suitably shaping a layer of a metal, such as aluminum, in the proximity of the integrated circuit surface.

It is on this very metal layer that the contacts are formed for connecting the integrated circuit electrically to its surroundings.

It is a well-known fact that monolithic integrated circuits are produced simultaneously and in large quantities from plates, better known as wafers, of some ordinary semiconductor material, usually crystalline silicon.

The total number of the circuits to be formed on a single wafer increases proportionately with a so-called "integration scale".

It should be noted that the peculiar methods of making integrated circuits, being as they are carried out on a microscopic scale, disallow subsequent repair of any faults of an electrical or mechanical nature developed incidentally during the various steps of the manufacturing process. It follows that a circuit is to be discarded at the slightest imperfection shown.

Thus, in the manufacture of monolithic integrated circuits, there exists a basic need to ensure that the largest possible number of the circuit formed on each silicon wafer can operate successfully from the electrical standpoint.

From the electrical standpoint, proper operation of an integrated circuit is tied to the method of linking the metallization level to the junction level.

As is well recognized in the art, the linking, which is required to occur at a predetermined fixed signal voltage or "threshold", becomes the more critical to achieve as its size decreases, that is the larger becomes the integration scale of the integrated circuit becomes.

To meet the above-outlined requirement, it is current practice to resort to a treatment known by the term of "aluminum annealing or "aluminium sintering".

The latter is directed to ensure proper electrical operation at the links between the aluminum metallization level and the junction level of doped crystalline silicon by acting in a twofold way, that is by lowering the resistance of the aluminum-silicon contact, and at the same time reducing the residual valence forces present at the interface of the silicon crystal lattice.

It is recognized, in fact, that both said contact resistance and said residual valence forces affect in an uncontrolled way the value of the link threshold voltage between the metallization and junction levels.

Investigation and research work carried out on the matter have brought out that the objectionable influence of the aluminum-silicon contact resistance originates from the presence of a thin layer of silicon oxide (a few tens Ångstrom thick). This is regarded as forming spontaneously due to the circuits being exposed to the atmosphere between the various steps of the manufacturing course.

In accordance with a prior art technique, the aluminum annealing treatment process is carried out within tubular furnaces inside which a reducing medium (atmosphere of a forming gas composed of 95% nitrogen and 5% hydrogen) is maintained. The presence of the aluminum metallization level poses, however, an upper limit to the furnace inside temperature, which is to be maintained at a lower value than 450° throughout the process (whose overall duration is usually of 120 minutes). Furthermore, the temperature in each radial section of the furnace requires each section to be strictly controlled to a typical flat profile with a maximum allowable deviation of $\pm 2°$ C.

Under such conditions, the following reaction takes place at the aluminum-to-silicon links, $$4Al + 3SiO_2 \rightarrow 2Al_2O_3 + 3Si \qquad (1)$$

whereby a drastic reduction is achieved in the contact resistance between the aluminum and the silicon by removing the layer of silicon oxide previously formed.

The hydrogen introduced into the furnace serves the function of reducing the residual valence forces present at the interface of the crystal lattice of the silicon forming part of the junction level.

In order to enable diffusion of the hydrogen through the levels overlying said junction level, and consequently, its reaching the interface of the silicon crystal lattice, an unchanging prior teaching is to maintain within the annealing furnace a pressure which does not go below atmosphere pressure.

However, from an engineering and commercial standpoint, the so-called "useful life" of the circuits obtained with the aluminum annealing technique is too short. This useful life is, as far as the electrical operating characteristics are concerned, shortened by such phenomena as electro-migration (a term used to designate an undesired transfer of matter inside the metal conductors of an integrated circuit) and corrosion. Accordingly, produced manufactured integrated circuits should have high long-term operating stability features. According to the techniques adopted heretofore, such features are imparted thereto by means of a treatment, known by the term of final passivation, which is applied subsequently to the aluminum annealing treatment and using procedures which are quite independent thereof.

The passivation treatment is directed to confer on the circuits, by the deposition of a protective film thereon, adequate protection against the environment, as well as to ensure close adhesion of the metal conductors of the metallization level to the circuit, thereby preventing the electro-migration phenomenon.

The protective film, usually either silicon nitride or silicon oxide slightly doped with phosphorus, is deposited within reactors of the CVD (Chemical Vapor Deposition) type, consistent with a well-established technique.

Where deposition of a film of phosphorus-doped silicon oxide (or P-glass) is envisaged in which the phosphorus percent is to be controlled below 4%, at temperatures not to exceed about 400° C., of special interest may be a deposition reactor of the PECVD (Plasma Enhanced CVD) type.

The standard operating conditions of such reactors provide for a temperature within the range of 300° to 380° C., a pressure around 1 Torr, and continuous feeding of a gas stream comprising $SiH_4$, NO, $PH_3$, and an inert gas, such as Argon with carrier gas functions. The deposition plasma is instead obtained, as a rule, by means of 400 kHz radio frequency supply.

The whole deposition cycle, including the steps of film deposition following loading and heating, and wafer cooling and unloading, lasts approximately 180 minutes, while the number of wafers that can be processed simultaneously within a conventional design PECVD reactor lies within the 100-unit range.

However, the manufacture of integrated circuits in accordance with prior methods has a number of drawbacks, and in the first place an undesired, and unavoidable, effect of mechanical damage to the circuits. This is a direct consequence of the reiterate manipulations to which the wafers are subjected and occurs on the occasions of the annealing furnace and passivation reactor loading and unloading operations.

As a result of such mechanical damage, which generally shows up in the forms of breaks in the metallic conductors or breaks in the passivating film due to wafer scuffing, a decrease is suffered in the electrical yield of the circuits. In a known manner, this is the term used to indicate the ratio of the number of circuits operating properly from the electrical standpoint to the total number of the circuits processed.

An additional drawback of significance is the high manufacturing cost of the circuits brought about by both the equipment cost and the cost of the dedicated space therefor in the so-called "clean room", as well as by the long times taken up by the need to first subject the integrated circuits to the aluminum annealing treatment and then to the final passivation treatment.

The technical problem underlying this invention is to provide a method of manufacturing monolithic integrated circuits which can ensure the largest possible number thereof with proper and long-term stable electrical operation features, while overcoming the drawback affecting the prior art.

This technical problem is solved, according to the invention, by a method as indicated comprising a process step of aluminum annealing and a process step of final passivation, and being characterized in that said steps are carried out at least in part simultaneously at a pressure of 1 to 1.5 Torr and at a temperature above 420° C.

In accordance with the method of this invention and unlike prior teachings, performing the aluminum annealing and final passivation treatments under such pressure conditions has surprisingly revealed an unexpected and improved activity of the hydrogen in reducing the residual valence forces which appear at the silicon crystal lattice interface.

Advantageously, and on accordance with a further aspect of this invention, the above-noted aluminum annealing and final passivation treatments are applied inside a PECVD deposition reactor, owing to its ability to maintain a constant temperature in its interior. The last-mentioned condition is, as will be recalled, a binding one for the aforementioned reaction (1) to take place as is typical with the aluminum annealing treatment.

The method of this invention will afford, as a result, the following benefits:

improved electrical yield of the circuits produced; and reduction in the overall manufacturing costs as brought about by savings in equipment (elimination of the aluminum alloying furnace), and reduction in the working time and clean room dedicated space requirements.

Further features and advantages of the inventive method will become more clearly understood by making reference to the following detailed description of a preferred, though not exclusive, embodiment thereof, to be taken by way of example and not of limitation.

The various steps of the method according to this invention are carried out within a JANUS Model PECVD reactor by Semy whose design is quite conventional.

A set including 100 silicon wafers, containing CMOS-KH1 circuits on a single metallization level, have been loaded in a boat and then introduced into the reactor. The wafers were then subjected to pre-heating up to a temperature of about 250° C.; the pressure inside the reactor was subsequently brought down to 1.5 Torr while introducing at the same time a continuous stream of nitrogen at a volume rate of 2000 sccm (standard cubic centimeters per minute).

Steady pressure and temperature conditions were achieved after about 3 minutes. Then, the reactor inside temperature was gradually raised (within an about 10-minute period) up to a value of 450° C. and held thereat with a maximum deviation of ±2° C.

Under this temperature condition, as controlled so as to maintain a constant flat-profile value in each radial section of the reactor, the metallurgic reaction between the aluminum and the silicon oxide present in the link zones between the metallization level and the silicon substrate was started. In accordance with a characterizing aspect of the inventive method, in order to enhance the reduction of residual valence forces present at the crystalline silicon substrate interface, streams of $SIH_4$ and $N_2$ (as carrier gas) are admitted for an about 5-minute time into the reactor at volume rates of 168 and 2000 sccm, respectively.

The silane introduced into the reactor, owing to the combined action of temperature and pressure, becomes ionized to release hydrogen atoms to the surrounding medium. Thus, a reducing medium is created which, by virtue of the hydrogen production diffusing through the various circuit levels, initiates a step of pre-reduction of the aforesaid residual valence forces.

On completion of this pre-reduction step, the inflow of $SiH_4$ and $N_2$ was discontinued and the pressure inside the reactor was further reduced to a value of 1 Torr. A fresh stream of gas comprising a mixture of $SiH_4$ (168 sccm), $PH_3$ (8 sccm), Argon (268 sccm), and NO (2200 sccm) was then fed into the reactor. Under these pressure and temperature conditions, the deposition of P-glass passivating film is started, and takes place in conformity with the following reactions,

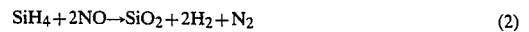   (2)

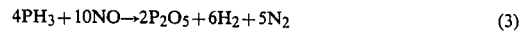   (3)

The passivating film deposition rate, its thickness and uniform doping were regulated by controlling the kinetics of the above-noted reactions by means of plasma provided by a 40 kHz radio frequency generator. In particular, the percent by weight of the phosphorus in the passivating film was held below 3% to avoid corrosion problems with the circuits produced, to avoid with the possible formation of phosphoric acid on their outer surfaces upon contact with the atmospheric humidity.

According to the method of this invention, both the reduction of residual valence forces of the silicon crystal lattice and the metallurgic reaction of the aluminum with the silicon oxide at the links between the metallization and junction levels, proceed under the temperature and pressure conditions established within the PECVD reactor.

Advantageously, the hydrogen rrequired for carrying on the aabove reduction reactions is supplied directly to the reactor interior from the P-glass passivating film deposition reactions (2) and (3).

It should be also noted that the typical reactions of the aluminum annealing process step take place in the absence of any interference from the plasma generated during the passivating film deposition.

On completion of the passivating film deposition step, which lasts about 30 minutes, the reactor was subjected to a flushing operation using a nitrogen stream at a flow rate of 2000 sccm for an about 30-minute time. Subsequently, the reactor was brought to atmospheric pressure, again using a nitrogen stream at 2000 sccm and for an about 11-minute time.

Concurrently with the pressure raising step, the temperature was decreased gradually to a value of about 300° C., which is the same temperature as the wafers' on exiting the reactor.

Once atmospheric pressure is reached, the boat is removed from the reactor and the wafers allowed to cool in air until room temperature is reached.

The method according to the invention was then repeated, using the same procedures as specified above, on a like number of wafers containing double metallization level CMOS-KH2 and CMOS-KH3 circuits.

A second set of CMOS-KH1, -KH2, and -KH3 integrated circuits, as formed on a like number of wafers, were instead subjected to conventional aluminum annealing and final passivation treatments, respectively within a MINI BRUTE furnace (by Thermco) and a JANUS Model PECVD reactor (by Semy).

On each circuit set, electrical measurements of a conventional kind were then taken to determine the number of the circuit operating correctly from an electrical standpoint of the total number of circuits produced.

For each CMOS-KH1, -KH2 and -KH3 circuit type, as respectively produced with conventional aluminum annealing and final passivation treatments, and with the method according to this invention, the electrical yield EWS was then calculated from the above-mentioned electrical measurements.

The data related to the production of each circuit type are summarized by the following chart:

| CIRCUIT | CONVENTIONAL AL ALLOYING AND PASSIVATION TREATMENTS | | | INVENTIVE METHOD | | |
|---|---|---|---|---|---|---|
| | gross | good | EWS (%) | gross | good | EWS (%) |
| CMOS-KH1 SINGLE METALLIZATION LEVEL | 21100 | 11620 | 55 | 21100 | 12790 | 60.6 |
| CMOS-KH2 DOUBLE METALLIZATION LEVEL | 11900 | 6330 | 53.1 | 11900 | 6920 | 58.1 |
| CMOS-KH3 DOUBLE METALLIZATION LEVEL | 44300 | 12540 | 28.3 | 44200 | 16780 | 37.8 | where:
gross=overall number of circuits formed on a total of 100 wafers;
good=arithmetical mean value, as calculated for a total of 100 wafers, of the number of devices operating correctly from the electrical standpoint;
EWS=percent electrical yield=(good/gross)×100.

As shown by the above chart, the method of this invention has led to the achievement of an advantageous and outstanding increase in the electrical yield of the circuits produced, which increase shows to be 5.6% for the CMOS-KH1 circuits, 5% for the CMOS-KH2s, and as much as 9.5% for the CMOS-KH3s.

Lastly it should be noted that such an improvement in the electrical yield of the integrated circuits produced has been achieved by the inventive method due to the following combined factors:
improved reduction activeness on the residual valence forces of the silicon crystal lattice;
reduction in the faults induced incidentally in the circuits during their manipulation; and
lower thermal stress induced in the metallization level of aluminum.

I claim:

1. A method of manufacturing monolithic integrated circuits, comprising a process step of aluminum annealing and a process step of final passivation, characterized in that said steps are carried out at least in part simultaneously at a pressure of 1 to 1.5 Torr and a temperature of about 450° C.

2. A method according to claim 1, characterized in that said steps are carried out within a PECVD deposition reactor.

3. A method of manufacturing monolithic integrated circuits, comprising the successive steps of:
feeding said circuits into a PECVD deposition reactor;
providing, inside said reactor, an inert atmosphere controlled at a pressure of about 1.5 Torr, by a nitrogen stream infeed;
initiating an aluminum annealing treatment by raising the temperature to a value of about 450° C. and injecting a stream of $SiH_4$ and $N_2$;
initiating, after a predetermined time period and while continuing the aluminum annealing treatment, a deposition of a passivating film, following further lowering of the pressure down to about 1

Torr, by the infeed of a stream of $SiH_4$, $PH_3$, Argon, and NO, and concurrent generation of a deposition plasma therefrom;

flushing the interior of said reactor by the infeed of a nitrogen stream; and unloading, at the end of a predetermined time period, said circuits from said reactor after the pressure has been raised to atmospheric and the temperature decreased to about 300° C.

4. The method of claim 1, wherein the steps are carried out in the presence of hydrogen formed by the decomposition of a silicon-hydrogen compound.

5. In a process of manufacturing monolithic silicon integrated circuits having aluminum contacts and subjected to an aluminum annealing treatment in the presence of hydrogen to lower contact resistance and reduce residual valence forces and to a passivation treatment to increase the lifetime of the circuits, the improvement of increasing the yield of satisfactory circuits by the steps of:

(a) partly simultaneously carrying out the annealing treatment and the passivation treatment at a pressure of 1–1.5 Torr and at a temperature of about 450° C. in the presence of hydrogen.

6. The process of claim 5, wherein step (a) is carried out by:

(b) providing the circuits in a PECVD deposition reactors, (c) raising the temperature in the reactor to about 450° C. and providing in the reactor an atmosphere of 1–1.5 Torr, (d) introducing into the reactor a silicon-hydrogen compound to cause decomposition thereof to produce free hydrogen to initiate the aluminum annealing treatment, (e) thereafter introducing into the reactor a gas stream including a silicon-hydrogen compound and generating a deposition plasma within the reactor to produce free hydrogen to continue the aluminum annealing treatment while simultaneously initiating the deposition of a passivating film on the surface of the integrated circuits, the temperature of the reactor being maintained at about 450° C. and the atmosphere at 1–1.5 Torr, (f) thereafter raising the reactor atmosphere to atmospheric pressure and reducing its temperature below 420° C.

7. The process of claim 6, wherein the silicon-hydrogen compound supplied during steps (d) and (e) is silane.

* * * * *